(12) United States Patent
Bauer et al.

(10) Patent No.: US 7,663,218 B2
(45) Date of Patent: Feb. 16, 2010

(54) INTEGRATED CIRCUIT COMPONENT WITH A SURFACE-MOUNT HOUSING

(75) Inventors: Michael Bauer, Nittendorf (DE); Edward Fuergut, Dasing (DE); Simon Jerebic, Regensburg (DE); Hermann Vilsmeier, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 69 days.

(21) Appl. No.: 11/839,740

(22) Filed: Aug. 16, 2007

(65) Prior Publication Data

US 2008/0029874 A1    Feb. 7, 2008

Related U.S. Application Data

(63) Continuation of application No. PCT/DE2006/000270, filed on Feb. 15, 2006.

(30) Foreign Application Priority Data

Feb. 17, 2005   (DE) .................... 10 2005 007 486

(51) Int. Cl.
*H01L 23/48*   (2006.01)
(52) U.S. Cl. .................. 257/690; 257/693; 257/698; 257/731; 257/779; 257/E21.499; 257/E23.061; 257/E23.119; 257/E33.058
(58) Field of Classification Search ............... 257/690, 257/693, 698, 731, 779, E21.499, E23.061, 257/E23.119, E33.058
See application file for complete search history.

(56) References Cited

U.S. PATENT DOCUMENTS

| 4,209,481 | A | | 6/1980 | Kashiro et al. |
| 4,996,476 | A | * | 2/1991 | Balyasny et al. ............ 324/754 |
| 5,006,962 | A | * | 4/1991 | Haley ......................... 361/807 |
| 5,548,087 | A | | 8/1996 | Dahringer |
| 5,805,424 | A | | 9/1998 | Purinton |
| 6,188,582 | B1 | | 2/2001 | Peter |
| 6,259,036 | B1 | | 7/2001 | Farnworth |
| 2004/0036181 | A1 | | 2/2004 | Hedler et al. |
| 2006/0280320 | A1 | * | 12/2006 | Song et al. .................. 381/174 |

FOREIGN PATENT DOCUMENTS

| DE | 3635708 A1 | 4/1988 |
| EP | 0265077 A2 | 4/1988 |
| EP | 1213756 A2 | 6/2002 |

* cited by examiner

*Primary Examiner*—Andy Huynh
(74) *Attorney, Agent, or Firm*—Edell, Shapiro & Finnan, LLC (57) ABSTRACT

A semiconductor component including a surface-mount housing and a method for producing the same are described herein. The semiconductor component includes lead pieces embedded into a plastic housing composition and arranged on an underside of the housing. External contact areas of the lead pieces are free of the plastic housing composition. A structured solderable coating is arranged on the external contact areas that have been kept free of the plastic housing composition, the coating includes a plurality of electrically conductive and mechanically elastic contact elements.

9 Claims, 6 Drawing Sheets

INTEGRATED CIRCUIT COMPONENT WITH A SURFACE-MOUNT HOUSING

CROSS REFERENCE TO RELATED APPLICATIONS

This application is a continuation of International Application No. PCT/DE2006/000270, filed on Feb. 15, 2006, entitled "Semiconductor Component Having a Surface-Mount Housing and Method for Producing the Same," which claims priority under 35 U.S.C. §119 to Application No. DE 102005007486.3 filed on Feb. 17, 2005, entitled "Semiconductor Component Having a Surface-Mount Housing and Method for Producing the Same," the entire contents of which are hereby incorporated by reference.

BACKGROUND

Known housings for semiconductor components include lead pieces embedded into a plastic housing composition. External contact areas of the lead pieces are kept free of the plastic housing composition and are arranged on an underside of the housing. Housings of this type are also called "leadless packages." Surface-mount housings of this type have hitherto been positioned onto a printed circuit board of a superordinate circuit. For this purpose, corresponding contact pads which correspond in size, arrangement and form to the lead pieces or external contact areas of the lead pieces and are kept free of plastic housing composition are provided on the printed circuit boards. The surface-mount housings are oriented in such a way that a soft solder connection, for example, composed of SnPb or SnAgCu, can be realized between the two areas in a soldering operation.

The increasing miniaturization of the components compels a continuous reduction of the quantity of solder available for these connections. Since the housings of the semiconductor components and the printed circuit boards comprise different materials, shear stresses arise during thermal loadings and affect the connections between semiconductor component or the external areas and the soft solder connections of the semiconductor components with the contact pads of the printed circuit boards. The shear stresses can contribute to the complete failure of the overall circuit if one of these solder connections is interrupted on account of the thermal loadings.

The thermal loadings are caused by the different coefficients of thermal expansion (CTE), which are approximately 3 ppm/° C. for semiconductor chips composed of silicon, 10 ppm/° C. for the plastic housing composition, approximately 18 ppm/° C. for copper and approximately 18 ppm/° C. for the printed circuit board material. Any difference in thermal expansion between the printed circuit board and the component to be mounted leads to such shear stresses in the soldered joint lying between component and printed circuit board.

If the number of thermal cycles increases, then this leads to fatigue of the soldered joint and failure of the component or an interruption of the electrical connection between semiconductor component and printed circuit board can thus occur. This risk is also increased if the solder volumes are reduced and the sizes of the housings simultaneously increase in terms of their absolute dimensions. This effect occurs particularly in the case of the above mentioned surface-mount housings with lead pieces, such that their field of use is limited on account of the unreliable surface mounting possibilities.

A nonconductive film with nanopores is known which mechanically connected and hold together first and second electronic parts. The film has metal-filled nanopores extending through the thickness of the film, such that the two parts are contact-connected by the metal at least in some of the pores, wherein the film comprises a polymer film. The disadvantage of this construction is that the metal-filled nanopores cannot be assigned to one of the two parts in a targeted manner and are not fixed on one of the two parts, rather the contact-connection is left more or less to chance, such that precisely between the two parts one or else a plurality of metal-filled nanopores are positioned which produce an electrical pressure contact only when a corresponding contact pressure is exerted on the first and second electronic parts. Consequently, the metal-filled nanopores of a polymer film do not provide a reliable electrical connection between the parts that are to be electrically connected, the dependence on chance as to what region of the film with what number of nanopores falls precisely into the contact-connection region between two parts not ensuring a reliable connection even if thermal shear stress does not play a part in this connection technique based on pressure contact-making.

SUMMARY

An integrated circuit component, (e.g., a semiconductor component) including a surface-mount housing and a method for producing the same are described herein. The semiconductor component includes lead pieces embedded into a plastic housing composition and arranged on an underside of the housing. External contact areas of the lead pieces are kept free of the plastic housing composition. A structured solderable coating is arranged on the external contact areas that have been kept free of the plastic housing composition, the coating includes a plurality of electrically conductive and mechanically elastic contact elements.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention will now be explained in more detail with reference to the accompanying figures, where.

DETAILED DESCRIPTION

An integrated circuit component, (e.g., a semiconductor component) including a surface-mount housing and a method for producing the same are described herein. The integrated circuit component includes external contact areas on the underside of the housing in which the risk of the connection breaking away under thermal loading is reduced.

The semiconductor component further comprises lead pieces on the underside of the housing which are embedded into a plastic housing composition, wherein at least one external contact area of the lead pieces on the underside of the housing is free of plastic housing composition. The external contact areas, for their part, comprise a structured solderable coating, wherein the structure of the coating of a single external contact area includes a plurality of electrically conductive and mechanically elastic contact elements arranged on the external contact area.

This semiconductor component has the advantage that the external contact areas on the underside of the semiconductor component with the plurality of electrically conductive and mechanically elastic contact elements which can follow a deflection as a result of different thermal expansions of the parts to be connected, without becoming fatigued and without tearing. Consequently, an otherwise solid soldered joint, which tends toward fatigue phenomena in the event of cyclic thermal loading, is replaced by a plurality of significantly smaller individual connections between a semiconductor component with a surface-mount housing and a printed circuit board.

In this case, the contact elements form the structured coating and can optionally be alloyed or soldered onto the external contact areas of the semiconductor component on the underside of the housing. For alloying or soldering thereon, the contact elements are held in a plastic film including corresponding through openings filled with the contact elements. In this case, the contact elements can optionally have a pillar form and/or a rib form, such that a reliable connection to the external contact areas of the surface-mount housing is possible.

The plastic film with through openings filled with the contact elements simultaneously serves as a holder during the bonding or soldering or alloying operation, in order that the plurality of contact elements for each of the external contact areas of the semiconductor component are held in an oriented manner and in position. For this purpose, the structured plastic film with through openings has the same thickness as the thickness of the structured coating to be formed on the individual external contact areas, with the result that the plastic film can also be maintained if the semiconductor component is to be fixed on a printed circuit board or on the contact pads of a printed circuit board.

Optionally, therefore, the structured plastic film comprises a plurality of through openings filled with contact-making material, wherein the plurality of filled through openings is adapted to the plurality of contact elements per external contact area of the semiconductor component. Furthermore, the areal extent of the film is adapted to the areal extent of the underside of the semiconductor component and the film, in the positions of the external contact areas, in each case comprises a plurality of through contact openings with contact elements arranged therein per external contact area.

A semiconductor component comprising such a film on its underside has the advantage that a correspondingly structured coating does not have to be provided for each individual external contact with the aid of a correspondingly small film, rather that a larger film adapted to the areal extent of the underside of the semiconductor component is available which is only structured in the regions in which a plurality of contact elements are to be made available for corresponding external contact areas.

In a further exemplary embodiment, the structured plastic film may be provided as a photolithographically structurable layer on the underside of the semiconductor component, the layer comprising a plurality of metal-filled through openings in the regions of the external contact areas of the surface-mount housing. In this case, the metal fillings of the through openings form the structured coating.

Also described herein is a mounting arrangement comprising a semiconductor component according to the above-described type and a printed circuit board, on which the surface-mount semiconductor component is arranged by its external contact areas on corresponding contact pads via a solder layer. In this optional mounting arrangement, the structured coating comprising a plurality of contact elements is arranged between the solder layer of the contact pad and the external contact area. In this case, the plurality of contact elements are fixed on the external contact area of the semiconductor component and are simultaneously soldered to the solder layer on the contact pads of the printed circuit board, while the plastic material of a plastic film is arranged between the contact elements on the external contact area.

The described mounting arrangement has the advantage that via the plastic material that remains enclosed between the contact elements, care is taken to ensure that no solder material of the solder coating of the contact pad of the printed circuit board fills the interspaces between the contact elements of the structured coating of the external contact areas and thereby possibly impedes or completely cancels the elasticity and flexibility of the contact elements of the structured coating. Therefore, a material which is extremely compliant and approximately rubber-elastic is provided as plastic material or plastic film with contact elements in its through openings. The contact elements, for their part, can be both elastically and plastically deformable and are configured in filigree fashion in such a way that they have lower fatigue embrittlement in the event of cyclic thermal loading.

A method for producing a surface-mount semiconductor component is likewise described herein. The semiconductor component comprises a plurality of electrically conductive and mechanically elastic contact elements on external contact areas of the underside of the semiconductor component; the method includes the following method steps.

The first step involves producing a plastic film with a multiplicity of through openings, wherein the number, arrangement and size of the through openings are adapted to the plurality of contact elements on the external contact areas. Thereafter, the through openings in the film are filled with electrically conductive material of the contact elements, which are held in position by the film. Afterwards, the film is oriented and applied to the underside of the semiconductor component with its external contact areas. Finally, the contact elements are alloyed or soldered onto the external contact areas of the semiconductor component with the aid of the film, which, during the alloying and/or soldering process, supports the contact elements arranged in the through openings.

The described method has the advantage that the structuring of the coating according to the exemplary embodiment of the external contact areas of the surface-mount semiconductor component with a plurality of contact elements can be produced relatively inexpensively and simply in a parallel process. Furthermore, this method has the advantage that it provides semiconductor components which can be initially stored independently of superordinate circuit boards and can be called up at any time by the customer.

Finally, the described method has the advantage that the contact elements have already been fixed on the external contact areas and, unlike in the prior art, do not first have to be aligned and oriented by the customer. Consequently, alignment and other problems are kept away from the customer, with the result that the customer can use the semiconductor component in the same way as a standard semiconductor component hitherto, but with the advantage that the problems of fatigue embrittlement in the solder connections have largely been surmounted.

An alternative method for producing a surface-mount semiconductor component including a plurality of electrically conductive and mechanically elastic contact elements on external contact areas on the underside of the semiconductor component includes the following method steps.

The first step involves applying a photolithographically structurable plastic layer to the underside of the semiconductor component. Thereafter, the plastic layer is formed with a plurality of through openings through the plastic layer to the external contact areas of the semiconductor component by structuring the plastic layer. Finally, the through openings are filled with the material of the contact elements with the contact elements being connected to the external contact areas. In particular, electro deposition methods or electroless chemical deposition methods of metals are suitable for filling the through openings in the photolithographically structurable plastic layer. In this case, too, the pluralities of contact elements are produced on the external contact areas of the semiconductor component via a parallel method, such that it is not necessary for each contact element to be applied individually to the external contact area. Moreover, the structured plastic layer protects the interspaces between the contact elements against ingress of solder material.

A further exemplary embodiment of the method for surface-mounting a surface-mount semiconductor component comprising a plurality of electrically conductive and mechanically elastic contact elements on the external contact areas on the printed circuit board including contact pads, the arrangement and size of which correspond to the external contact areas. This method comprises the following method steps.

The first step involves coating the contact pads on the printed circuit board with a solder material. Subsequently, the semiconductor component is oriented and applied on the printed circuit board by its contact elements which are surrounded by a plastic film material. Finally, the contact elements are soldered on the solder coating by heating the solder coating. In this case, the plastic film material surrounding the contact elements advantageously protects the contact elements against being enveloped by the solder material during the soldering operation and thus losing the elastic and compliant properties.

In the following, exemplary embodiments of the devices and methods are described in connection with the figures.

Figure 1:
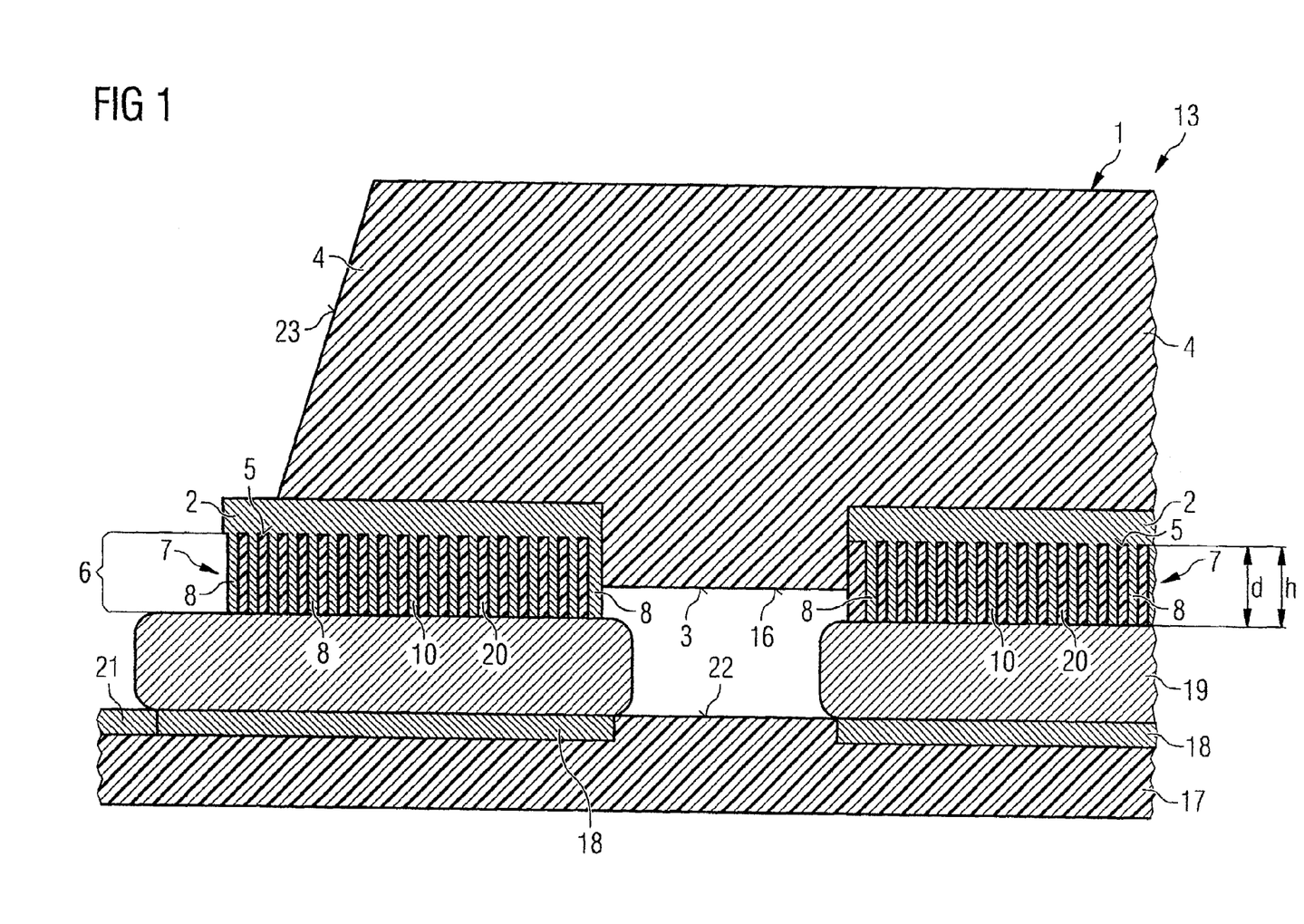
FIG. 1 shows a schematic cross section through the edge region of a surface-mount semiconductor component of a first embodiment.

FIG. 1 shows a schematic cross section through an edge region of a surface-mount semiconductor component 13 of a first embodiment. In particular the edge regions of surface-mount semiconductor components 13, which make contact with a printed circuit board 17 on which the semiconductor components 13 are arranged, are particularly jeopardized since the differences in the coefficient of thermal expansion between the printed circuit board 17 having a coefficient of thermal expansion of 18 ppm/° C. and the coefficient of thermal expansion of the plastic housing 1 of 10 ppm/° C. become apparent in the edge regions, especially as the edge regions are far away from the neutral center of the circuitry parts expanding relative to one another.

In this embodiment, the printed circuit board 17 is produced from a fiber-reinforced plastic board having on its top side 22 a wiring structure 21 composed of a structured copper layer, wherein the wiring structure 21 has contact pads 18 covered with a solder layer 19. Via the solder layer 19, the surface-mount semiconductor component 13 is connected both mechanically and electrically to the wiring structure 21 of the printed circuit board 17.

For this purpose, the semiconductor component 13 comprises a surface-mount housing 1 formed by a plastic housing composition 4 embedding the component parts of the semiconductor component 13. On the underside 3 of the housing 1, which at the same time also constitutes the underside 3 of the plastic composition and also the underside 16 of the semiconductor component 13, the housing 1 comprises lead pieces 2, an external contact area 5 of which is kept free of plastic housing composition 4. The lead pieces 2 form surface-mount external contacts and are embedded in the plastic housing composition 4 to an extent such that they are accessible for electrical connections only in the edge region 23 of the housing 1 and on the underside 3 of the housing 1.

A structured coating 6 having a thickness d is arranged on the external contact area 5 of the lead piece 2 that is kept free of plastic housing composition 4, wherein the structuring of the structured coating 6 comprises contact elements 8 and plastic material 20 surrounding the latter. In this case, the contact elements 8 have a height h corresponding to the thickness d of the structured coating 6. The plastic material 20, which fills the interspaces between the contact elements 8 of the structured coating 6, ensures that when the contact elements 8 are soldered onto the solder layer 19, no solder material penetrates into the interspaces and thus jeopardizes the function of the plurality of contact elements 8.

The plurality of contact elements 8 in the coating 6 not only brings about a mechanical connection of the semiconductor component 13 on the printed circuit board 17, but also ensure, by virtue of their elasticity and compliance, that the semiconductor component 13 on the printed circuit board 17 can be exposed to thermal loadings without the resultant shear stresses causing fatigue of the material of the contact elements 8 or the material of the solder layer 19. The plastic material 20 is also composed of an elastomer which can compliantly follow the deformations of the contact elements 8 as a result of thermal loadings or yield to them. This loading and the reaction of the structured coating 6 become clearer from the next figure.

Figure 2:
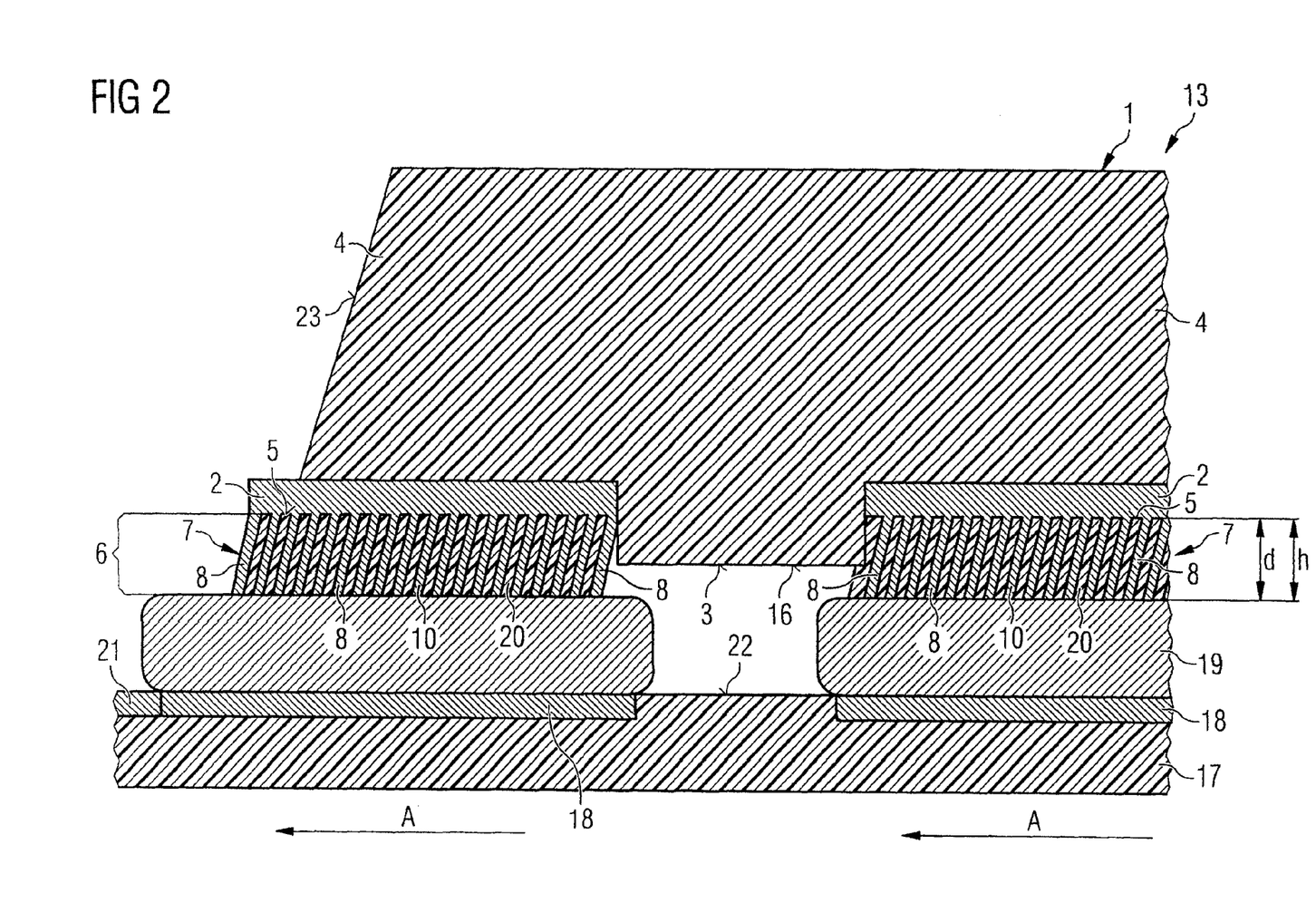
FIG. 2 shows a schematic cross section through the edge region in accordance with FIG. 1 under thermal loading of the semiconductor component.

FIG. 2 shows a schematic cross section through the edge region of the semiconductor component 13 in accordance with FIG. 1 under thermal loading of the semiconductor component 13. In the event of a temperature increase, the printed circuit board 17 expands in arrow direction A to a greater extent than the plastic housing composition 4 in the edge region of the semiconductor component 13. Via the plurality of contact elements 8 in the structured coating 6, the transition from the external contact area 5 of the semiconductor component 13 to the solder layer 19 on the contact pads 18 of the printed circuit board 17 is resiliently cushioned in such a way that fatigue of the solder layer 19 is avoided since its loading by shear stresses is reduced by comparison with a direct solder connection between the external contact area 5 and the solder layer 19. While in this exemplary embodiment the plastic housing composition 4 is still partly arranged between the structured coatings 6 of the lead pieces 2 and could thus impede the compliance of the structured coating 6, this is reduced via a second exemplary embodiment of the semiconductor component 14, which is shown in FIG. 3.

Figure 3:
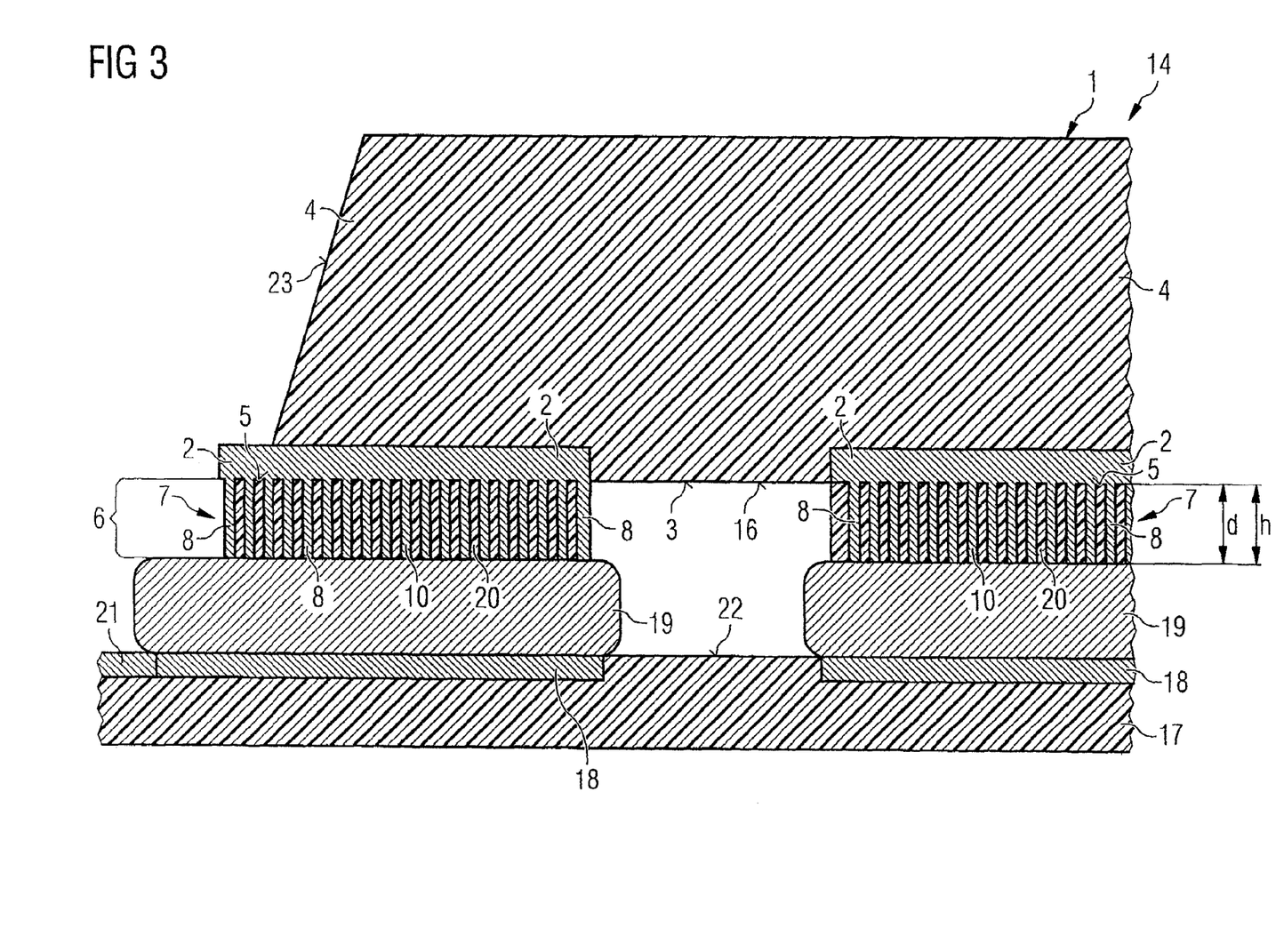
FIG. 3 shows a schematic cross section through an edge region of a surface-mount semiconductor component of a second embodiment.

FIG. 3 shows a schematic cross section through an edge region of a surface-mount semiconductor component 14 in accordance with a second exemplary embodiment. Component parts having the same functions as in the previous figures are identified by the same reference symbols and are not discussed separately.

In this exemplary embodiment, the plastic housing composition 4 extends only as far as the external contact area 5 of the surface-mount lead pieces 2, while the structured coating 6 projects beyond the underside 3 of the surface-mount housing 1. Consequently, the external contact areas 5 together with the underside 3 of the plastic housing composition 4 form a coplanar area that simultaneously constitutes the underside 16 of the semiconductor component 14.

This variant has the advantage that the structured coating 6 projecting from the coplanar area can be oriented or aligned more easily on the solder layer 19 of the contact pads 18 of the printed circuit board 17. On the other hand, this structure has the disadvantage that during production each individual external contact area 5 is individually equipped with a corresponding structure composed of contact elements 8 and plastic material 20 arranged in-between, and in the event of storage of the semiconductor component 14 prior to final mounting on a printed circuit board 17, the filigree contact elements 8 on the external contact areas 5 can be exposed to storage-dictated loadings that might make later mounting more difficult. This is overcome via a third exemplary embodiment, as shown by the next figure.

Figure 4:
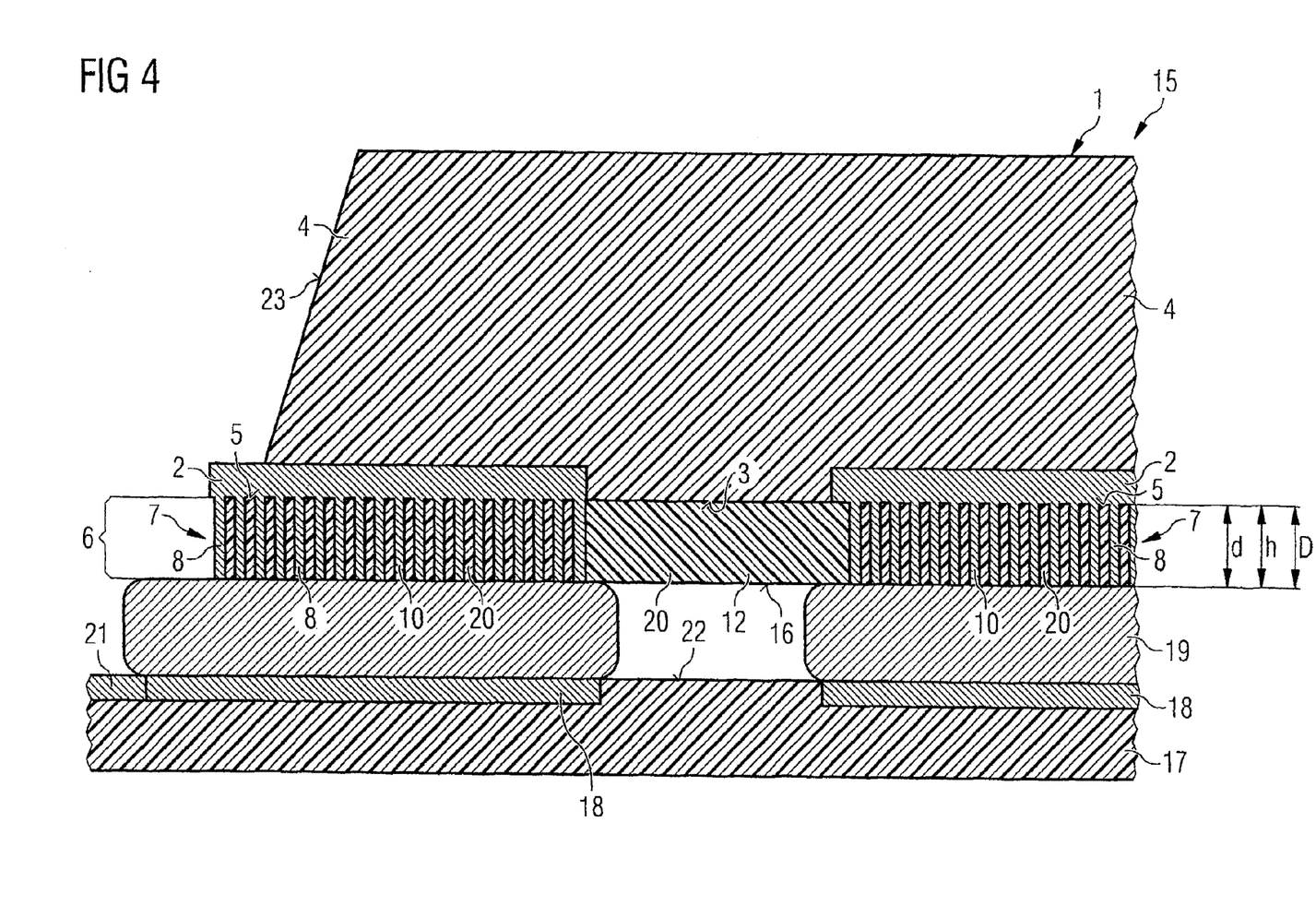
FIG. 4 shows a schematic cross section through an edge region of a surface-mount semiconductor component of a third embodiment.

FIG. 4 shows a schematic cross section through an edge region of a surface-mount semiconductor component 15 of a third exemplary embodiment. In this embodiment, too, component parts having the same functions as in the previous figures are identified by the same reference symbols and are not discussed separately. Here, too, the underside 3 of the plastic housing composition 4 forms a coplanar area with the external contact areas 5, but the entire underside 3 of the plastic housing composition 4 is covered with the plastic material 20 of the structured coating 6.

For this purpose, a plastic film 12 is used which has the thickness D corresponding to the thickness d of the structured coating 6. The plastic film 12 comprises through openings 11 exactly in the regions of the external contact areas 5, the through openings being filled with the material of the contact elements 8. The form of the through openings 11 simultaneously determines the form of the contact elements 8, a pillar form 10 or a rib form may be used. This exemplary embodiment has the advantage that the sensitive contact elements 8 on the external contact areas 5 of the semiconductor component 15 are better protected during storage and transport than in the embodiments discussed above.

Since the plastic film 12 is produced from a rubber-elastic elastomer, it also does not impede the free deformability of the elastic contact elements 8 on the external contact areas 5 of the semiconductor component 15.

Figure 5:
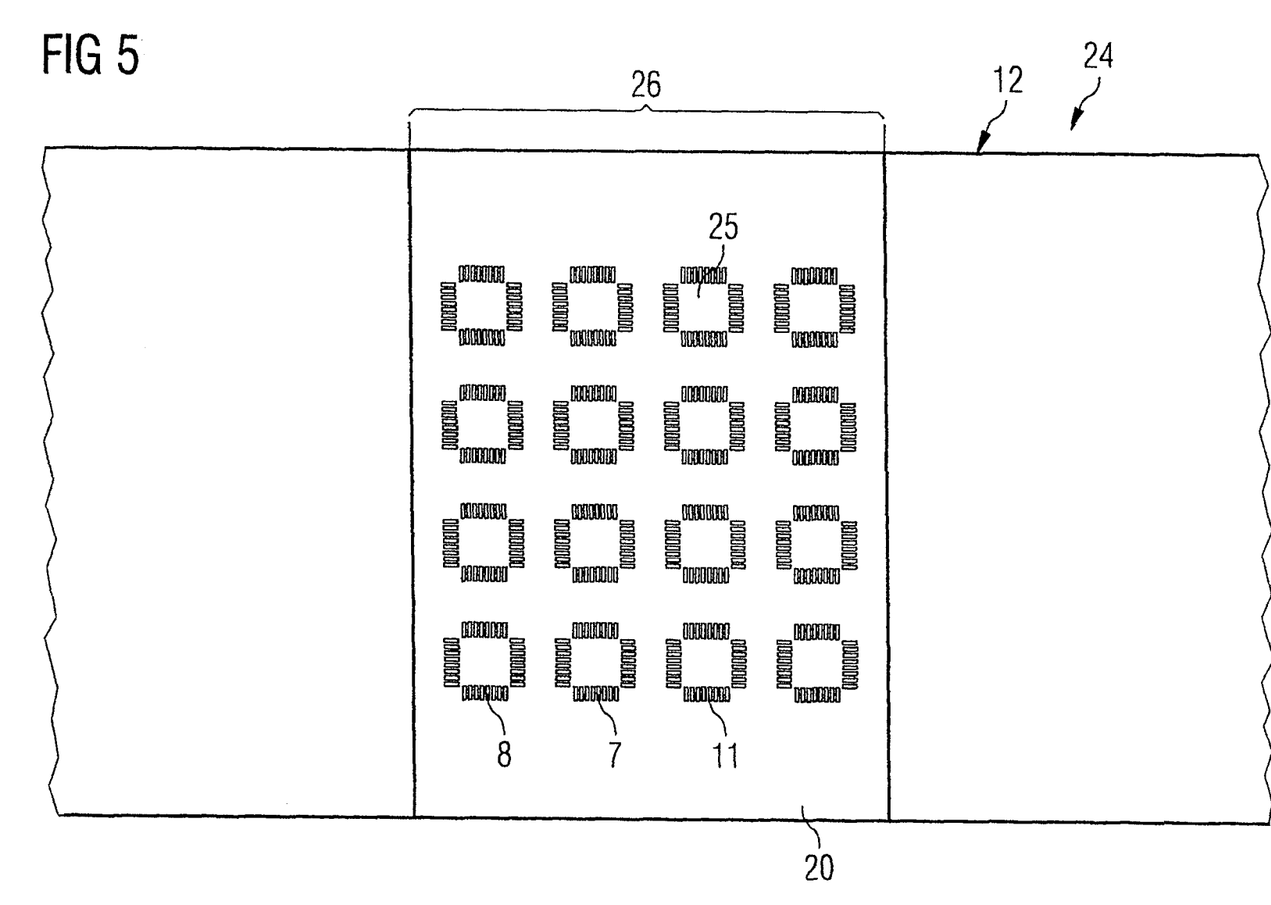
FIG. 5 shows a mounting film for the simultaneous application of a multiplicity of contact elements in corresponding external contact positions of a surface-mount housing.

FIG. 5 shows a mounting film 24 for the simultaneous application of a plurality of contact elements 8 in corresponding external contact positions 25 of a surface-mount housing 1. For this purpose, the mounting film 24 comprises a film strip including a plurality of semiconductor component positions 26, of which one semiconductor component position 26 of the mounting film 24 is shown in FIG. 5. This semiconductor component position 26 has sixteen external contact positions 25, wherein a plurality of contact elements 8 are arranged in each external contact area position 25.

Figure 6:
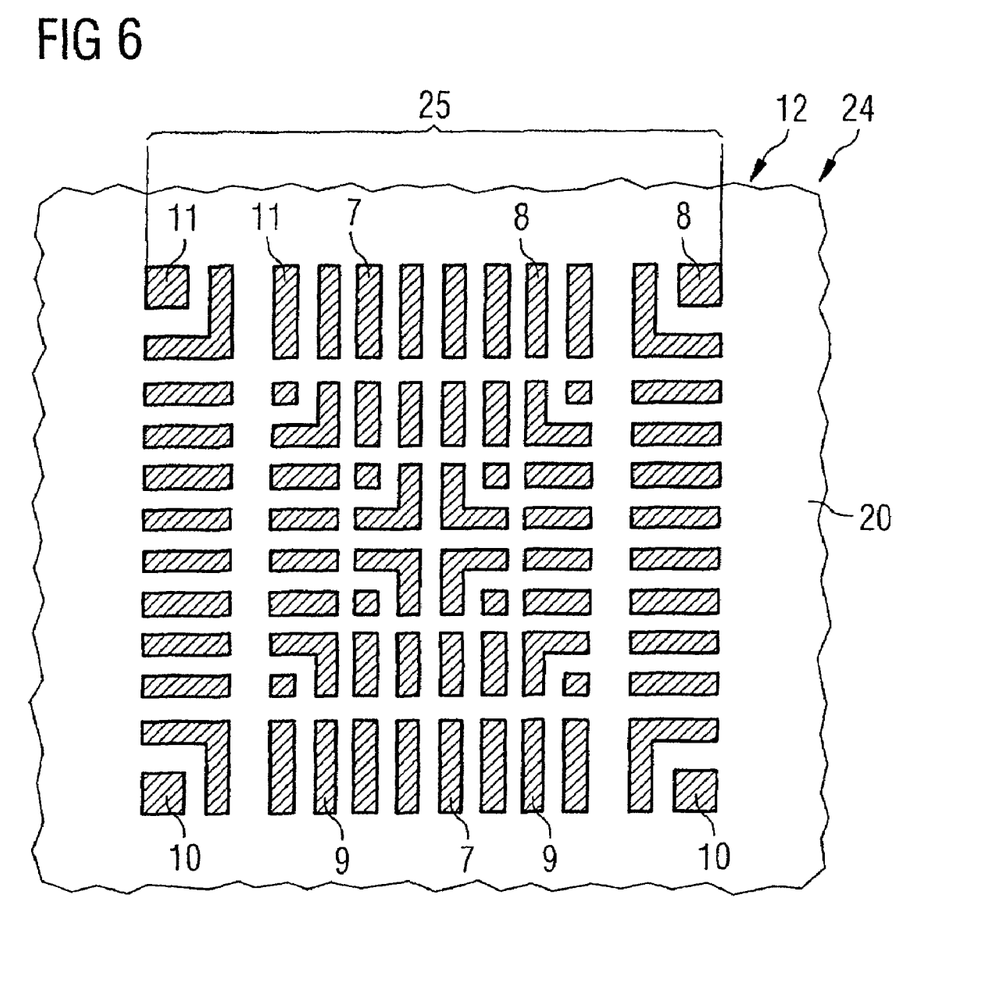
FIG. 6 shows an excerpt from a mounting film with metal-filled through openings in the region of an external contact area.

The contact elements 8 comprise a metallic material filling the through openings 11 extending through the mounting film 24 in the individual external contact area positions 25. As already mentioned above, the through openings 11 can have any desired form, optionally a pillar form and/or a rib form. In addition, the type of through openings 11 which are filled with contact elements 8 also depends on the production method of the mounting film 24 and the introduction method of through openings 11. The subsequent figure shows a photolithographically structured plurality of contact elements 8 in a plastic film 12 for an external contact area.

FIG. 6 shows an excerpt from a mounting film 24 with metal-filled through openings 11 in the region of an external contact area position 25. In the case of this construction, care was taken to ensure that the through openings 11 are arranged and structured in such a way that the plastic film 12 cannot fall apart, but rather can serve as a mask for the planned structured coating of an external contact area. In this case, in the region of the external contact area, through openings 11 were provided for a rib form 9 and/or pillar form 10 of the contact elements 8, which can subsequently alloy or solder correspondingly pillar-type or rib-type contact elements 8 on the external contact area. On the other hand, a film of this type can also serve as a mask in order to photolithographically realize the structured coating with corresponding contact elements 8 on the external contact area of the semiconductor component.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated circuit component, comprising:
   a surface-mount housing including:
      a plastic housing composition; and
      lead pieces disposed on an underside of the surface-mount housing and embedded into the plastic housing composition, the lead pieces comprising:
         at least one external contact area that is free of the plastic housing composition, the at least one external contact area including a structured solderable coating including a plurality of electrically conductive and mechanically elastic contact elements arranged on the external contact area.

2. The integrated circuit component according to claim 1, wherein:
   the contact elements comprise a rib form and/or a pillar form; and
   a height of the contact elements corresponds to a thickness of the structured coating.

3. The integrated circuit component according to claim 2, further comprising:
   a structured plastic film including a plurality of through openings, the contact elements being arranged in the through openings of the structured plastic film, wherein a thickness of the plastic film corresponds to the thickness of the structured coating.

4. The integrated circuit component according to claim 3, wherein the contact elements comprise a contact-making material.

5. The integrated circuit component according to claim 3, wherein an areal extent of the film corresponds to an areal extent of the underside of the integrated circuit component.

6. The integrated circuit component according to claim 1, further comprising:
   a structured plastic film including a plurality of through openings, the contact elements being arranged in the through openings of the structured plastic film, wherein a thickness of the plastic film corresponds to a thickness of the structured coating.

7. The integrated circuit component according to claim 6, wherein the contact elements comprise a contact-making material.

8. The integrated circuit component according to claim 6, wherein an areal extent of the film corresponds to an areal extent of the underside of the integrated circuit component.

9. A mounting arrangement including:
   the integrated circuit component of claim 1, wherein the structured coating further comprises a plastic material arranged between the contact elements and the external contact area;
   a solder layer; and
   a printed circuit board including contact pads corresponding to the external contact areas of the integrated circuit component, the integrated circuit component being arranged, by its external contact areas, on the printed circuit board via the solder layer;
   wherein the structured coating is arranged between the solder layer and the external contact area, the plurality of contact elements being fixed on the external contact area and being soldered to the solder layer.

* * * * *